United States Patent [19]

Maheras et al.

[11] 4,425,183

[45] Jan. 10, 1984

[54] METAL BEVEL PROCESS FOR MULTI-LEVEL METAL SEMICONDUCTOR APPLICATIONS

[75] Inventors: George Maheras, Fort Collins; Hubert O. Hayworth, Loveland, both of Colo.

[73] Assignee: NCR Corporation, Dayton, Ohio

[21] Appl. No.: 521,509

[22] Filed: Aug. 8, 1983

[51] Int. Cl.³ .................. C23F 1/02; C03C 15/00; C03C 25/06; B44C 1/22
[52] U.S. Cl. ..................... 156/651; 156/655; 156/656; 156/659.1; 430/316; 430/318
[58] Field of Search ........... 156/651, 655, 656, 659.1, 156/668, 643, 644; 430/313, 316, 317, 318; 427/38, 39

[56] References Cited

U.S. PATENT DOCUMENTS 4,354,897 10/1982 Nakajima ..................... 156/651 X

FOREIGN PATENT DOCUMENTS 55-26686  2/1980  Japan ........................ 156/651
56-87666  7/1981  Japan ........................ 156/643
57-20450  2/1982  Japan ........................ 156/643

*Primary Examiner*—William A. Powell
*Attorney, Agent, or Firm*—J. T. Cavender; Casimer K. Salys

[57] ABSTRACT

A process for beveling the sharp corners on an integrated circuit metal layer, which corners were created by commonly practiced masking and etching steps. In one form, the photoresist mask used to etch the lower level metal pattern is retained on the wafer as during the beveling operation. With a positive photoresist and an aluminum alloy metal lower level layer, an etch with an alkaline photoresist solvent will isotropically remove both photoresist and metal, but at a controlled difference in rate. Beveling of the metal corners suppresses the reentry effect otherwise encountered when subsequent dielectric materials are deposited over the lower level metal layer.

8 Claims, 6 Drawing Figures

METAL BEVEL PROCESS FOR MULTI-LEVEL METAL SEMICONDUCTOR APPLICATIONS

BRIEF SUMMARY

The invention relates to a process for fabricating integrated circuit wafers which have etched patterns of lower level metal covered by dielectric and subsequent levels of metal or other conductive interconnects. The process is particularly directed toward a fabrication technique by which the top corners of the first level of metal are beveled to produce a dielectric deposition topography without the classic reentry character.

According to the features central to the novel process, the photoresist mask used to define the lower level metal pattern is retained in place after etching the metal. Thereafter, the wafer is subjected to an isotropic etch using a solution which dissolves photoresist material and exposed metal at a measurably different rate. For an aluminum alloy metal layer and positive photoresist, an alkaline photoresist developer is a suitable etchant/solvent.

Following the preferred practice of the invention, the solution is expressly selected so that the photoresist is removed at approximately twice the rate that the metal is etched. This ratio accelerates curling or lifting of the photoresist etch to expose the top corners of the metal layer to the etching effect of the solution. Adjustments in the compatability of the etch rates can be made by hardening the photoresist, for example, by gas plasma treatment, or by selecting solutions having different pH number.

These and other unique features attributable to the present invention will be described with greater particularity in the ensuing development.

DETAILED DESCRIPTION

Among the features characterizing the trend of contemporary integrated circuit designs are those relating to the use of metallic interconnects to reduce resistance and thereby increase operating speed, those relating to reductions in the circuit dimensions, and those relating to increases in the number of interconnect levels. Though such features improve circuit density and operating speed, they tend to magnify certain fabrication problems heretofore considered manageable. In particular, the use of metal interconnects and smaller dimensions accentuates the effects of the topographical distortion known as reentry or cusping of a dielectric layer formed over a lower level metal layer. This is particularly true for commonly-utilized silicon dioxide (oxide) or silicon nitride (nitride) dielectric layers.

Figure 1:
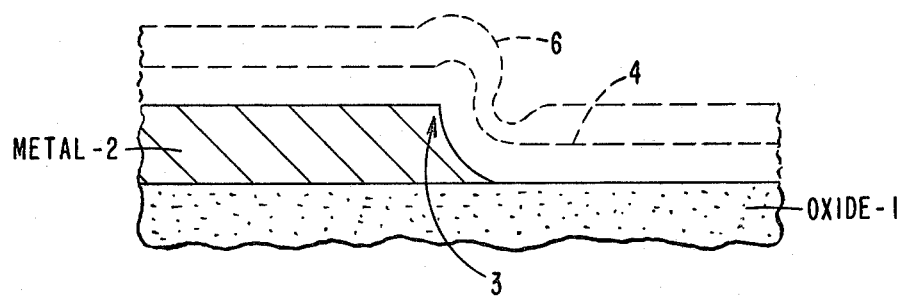
FIG. 1 is a schematic cross-section of a wafer at the edge of an etched metal layer with depictions of how reentry arises with an increase in the thickness of the dielectric layer.

To appreciate the nature of the problem, refer to the schematic cross-section in FIG. 1 of the drawings. As depicted, a substantially planar oxide layer 1 has metal layer 2 deposited thereon and etched using conventional photoresists and etchants. The sharp corner, 3, typically formed at the upper surface of metal layer 2 distorts subsequent depositions of oxide or nitride dielectric material to create first a peaking and thereafter a reentry or cusping of the dielectric deposited adjacent corner 3 of metal layer 2. This is illustrated in FIG. 1 by the topographic progressions as the dielectric increases in thickness from that represented by dashed line 4 to that represented by dashed line 6. It should be recognized that the sharp corner at 3 is created irrespective of whether a wet or dry etchant is utilized, and is generally even more pronounced with the highly anisotropic etches which are being utilized with increased frequency.

Figure 2:
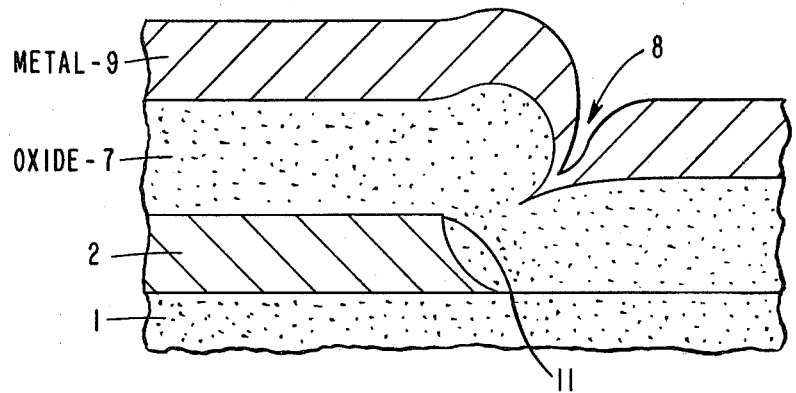
FIG. 2 is a schematic cross-section of the metal layer shown in FIG. 1 with a typical dielectric layer and its classic reentry characteristics.

The distortion in the shape of the dielectric does not evidence itself as a problem until subsequent metal or doped semiconductor interconnect levels are deposited and patterned. Referring to FIG. 2, it becomes apparent that reentry of oxide, or nitride, dielectric layer 7 at location 8 causes a significant reduction in the thickness of metal layer 9 at the same location. With the trend towards smaller dimensions and the importance of interconnect resistance, it is apparent that the practice in the prior art not only degrades performance but becomes acutely susceptible to direct or thermally-induced open circuits at the reentry locations.

Figure 6:
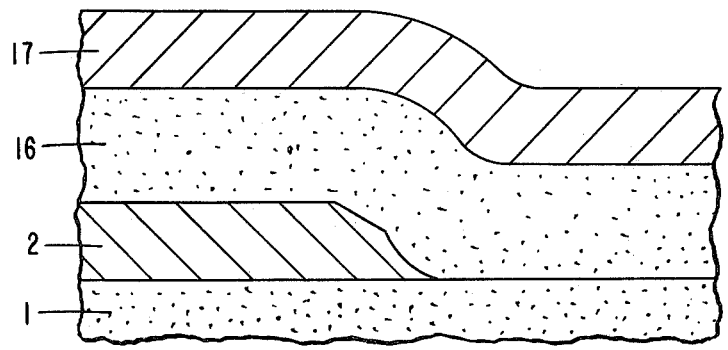
FIG. 6 is a schematic cross-section of the lower level metal layer covered by dielectric and a second level of metal when beveled in the manner of sequence depicted in FIGS. 3-5.

Although it is known that a beveling of metal corner 11 will suppress reentry and produce an acceptable overall topography (for example, see the end product of the present process as depicted in FIG. 6), processes suitable to accomplish this objective are not derived as readily as one might first perceive. Namely, the straight application of etching to the patterned metal removes additional metal, but seldom produces a significant reduction in the sharpness of the corners. The use of a second masking and etch sequence obviously complicates the fabrication process and may not be practical with dimensions typically sought from modern integrated circuit processes.

In response to this problem, the industry has moved in the direction of planarization with viscous materials. Namely, rather than contour the topology of the metal layer, planarization employs a conformal material such as polymide or spin-on glass to coat the wafer and thereby establish a relatively smooth new level upon which the dielectric can be formed without reentry. Though the technique provides acceptable dielectric isolation between conductive layers, the preference for pure oxide or nitride dielectric materials between layers has resulted in limited acceptance of planarization as the ultimate solution.

Figure 4:
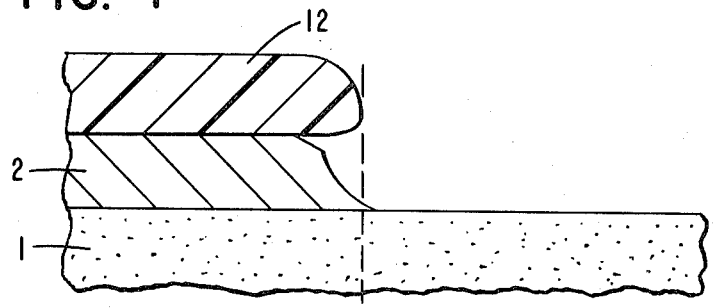
Figure 5:
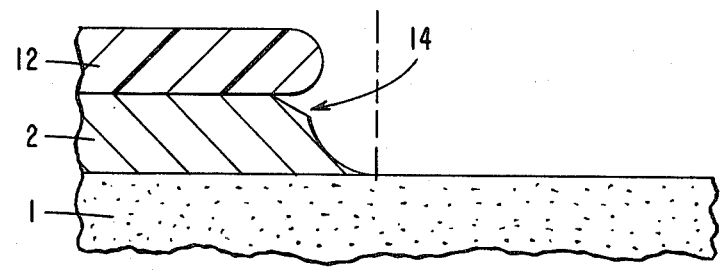

The presently disclosed process retains the integrity of pure oxide or nitride dielectric, deposited directly over the first metal layer, while overcoming the reentry problem, by providing a reliable process for beveling the corner of the lower level metal. Furthermore, the beveling is accomplished without additional masking operations or elaborate fabrication procedures. In addition, the present beveling process is readily controllable by varying the chemical composition of the etchant solution or through selective hardening of the photoresist material. Thereby, the beveling process can be adjusted for variations in the composition of the metal layer, the photoresist composition, or the solution used to perform the etch. The effects of the preferred implementation of the process are depicted in FIGS. 3-5.

Figure 3:
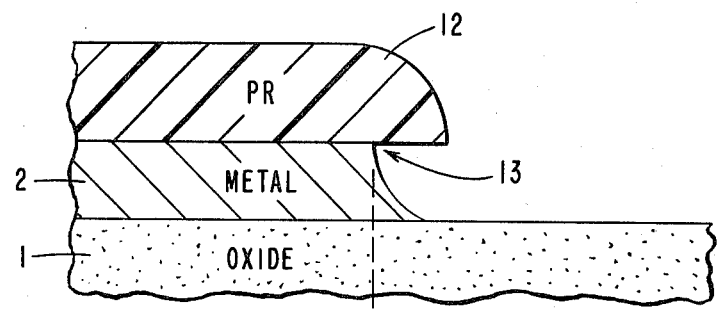
FIGS. 3-5 are schematic representations of the structure at incremental stages of the etching sequence according to the present invention.

FIG. 3 schematically illustrates the cross-section at the edge of metal layer 2 formed on dielectric layer 1. Preferably, dielectric layer 1 is composed of a plasma enhanced low pressure chemical vapor deposition (LPCVD) silicon dioxide. Metal layer 2 is preferably an aluminum alloy containing approximately one-half percent copper and one percent silicon by volume with a deposited thickness of a nominal 800 nanometers. Masking layer 12 is composed of commercially available positive photoresist (PR), marketed as AZ4110 by the American Hoechst Corporation. The preferred thickness of layer 12 is in the range of 1 micrometer. The illustration in FIG. 3 represents the structure at the conclusion of the metal etch, performed with a conventional etchant mixture of phosphoric acid, deionized water, and surfactant. Note that PR layer 12 overhangs metal layer 2 by approximately one micron after the metal etch operation.

According to the present process, the structure depicted in FIG. 3 is then subjected to a sequence of operations suitable to bevel the upper corners of metal layer 12 at location 13. In contrast to conventional processing which would call for a strip of PR mask 12 at this stage of fabrication PR mask 12 is retained in place as the wafer is subjected to isotropic etch in a bath of alkaline solvent, a solvent which is characterized by its dissolution of PR material 12 at approximately twice the rate that it etches exposed metal material 2. As is evidenced by the change in structure in progressing from FIG. 3 to FIG. 4, the selectivity of the etchant exposes the metal corner at location 13 by removing PR 12 in the immediate proximity of the corner faster than it etches metal 2. Consequently, the etchant undercuts PR layer 12 at 13 and causes a curling or lifting at the edge of the joint between PR 12 and metal 2. With the lifting, new regions of PR 12 and metal 2 are exposed to the etchant.

Etching in the solution is continued until the corner of metal 2 is substantially removed without unduly depleting the metal layer. The preferred outcome is shown schematically in FIG. 5 as the bevel at location 14. Recognize that the solution inherently etches both the PR and the metal, with the etch ratio ensuring the appropriate effect on the corner of metal layer 2.

The ease with which the present process may be implemented is further substantiated when one notes that the preferred solvent is a commercially marketed material, WX-108-4 photoresist developer manufactured by Hunt Chemical Company. Using this solution, at ambient temperature, the beveling process normally entails an etch of approximately one minute duration. The etch is followed by a rinse in deionized water.

The Hunt WX-108-4 photoresist developer has a pH in the range of 12. However, the features of the process can be implemented with alkaline solutions having other pH values, preferably those with a pH number greater than 7. As may now be recognized, the precise process conditions, including the etch duration and the form of the PR hardening, depend on the compositions of the metal alloy, the PR, and the solvent, as well as the extent of beveling sought.

The chemical solvency of the PR may be modified by hardening techniques to adjust the PR etch rate and the PR curling or lifting characteristics as a means of attaining the degree of beveling sought for different etching solvents or alloy compositions of the metal. For example, the integrity of the PR may be enhanced by utilizing a PR hardening technique, such as a treatment with luminous energy having a 200 nm wavelength or a gas plasma. An example of the latter, preferred, technique employs a gas ($N_2$) plasma within a barrel reactor operated at 1 Torr and with 500 watts power for approximately 30 minutes to condition patterned PR on wafers. Note, that such PR hardening can be performed either prior or subsequent to the etching of metal layer 2.

According to the preferred practice of the present process, where the PR is not expressly hardened, the wafer with beveled metal as depicted in FIG. 5 is thereafter subjected to a conventional PR strip using acetone and an $O_2$ plasma ashing operation. Thereafter, conventional fabrication is resumed.

The wafer region illustrated in FIG. 6 shows the wafer topology after plasma enhanced LPCVD oxide layer 16 is deposited. Note the absence of the reentry characteristic. As further shown in FIG. 6, dielectric layer 16 is then covered in conventional manner with another metal layer, 17.

It should be recognized that dielectric layer 16 in FIG. 6 is not constrained to an oxide or nitride composition, but may also be comprised of any one of numerous other dielectric materials.

It will no doubt be understood that the invention disclosed by express embodiments herein may be practiced by equivalent means without departing from the scope and spirit of the invention as claimed.

We claim:

1. A process for beveling the corner formed at the interface between a patterned metallic material layer and an overlying mask material layer implemented during the processing of an integrated circuit wafer, comprising the step of:
    etching both the metallic material and masking material using an isotropic etchant which removes masking material at a rate measurably faster than the etchant removes the metallic material.

2. The process recited in claim 1, wherein the difference in etch rate is a nominal magnitude of 2.

3. The process recited in claim 2, wherein: the metallic material is an aluminum alloy; and
    the masking material is a polymer photoresist.

4. The process recited in claim 3, wherein:
    the masking material is a positive photoresist; and
    the etchant has a chemical pH number of 7 or greater.

5. The process recited in claim 3, including the prior step of:
    conditioning the polymer photoresist to cross-link the chemical composition for greater integrity during etching.

6. The process recited in claim 5, wherein the conditioning is comprised of a photoresist hardening in an inert gas plasma environment.

7. The process recited in claim 6, wherein:
    the masking material is a positive photoresist; and
    the etchant has a chemical pH number of 7 or greater.

8. The process recited in claim 4, wherein:
    the metallic material is an alloy of aluminum with small percentages by volume of copper and silicon; and
    the etchant has a chemical pH number in the range of 12.

* * * * *